Figure 1:
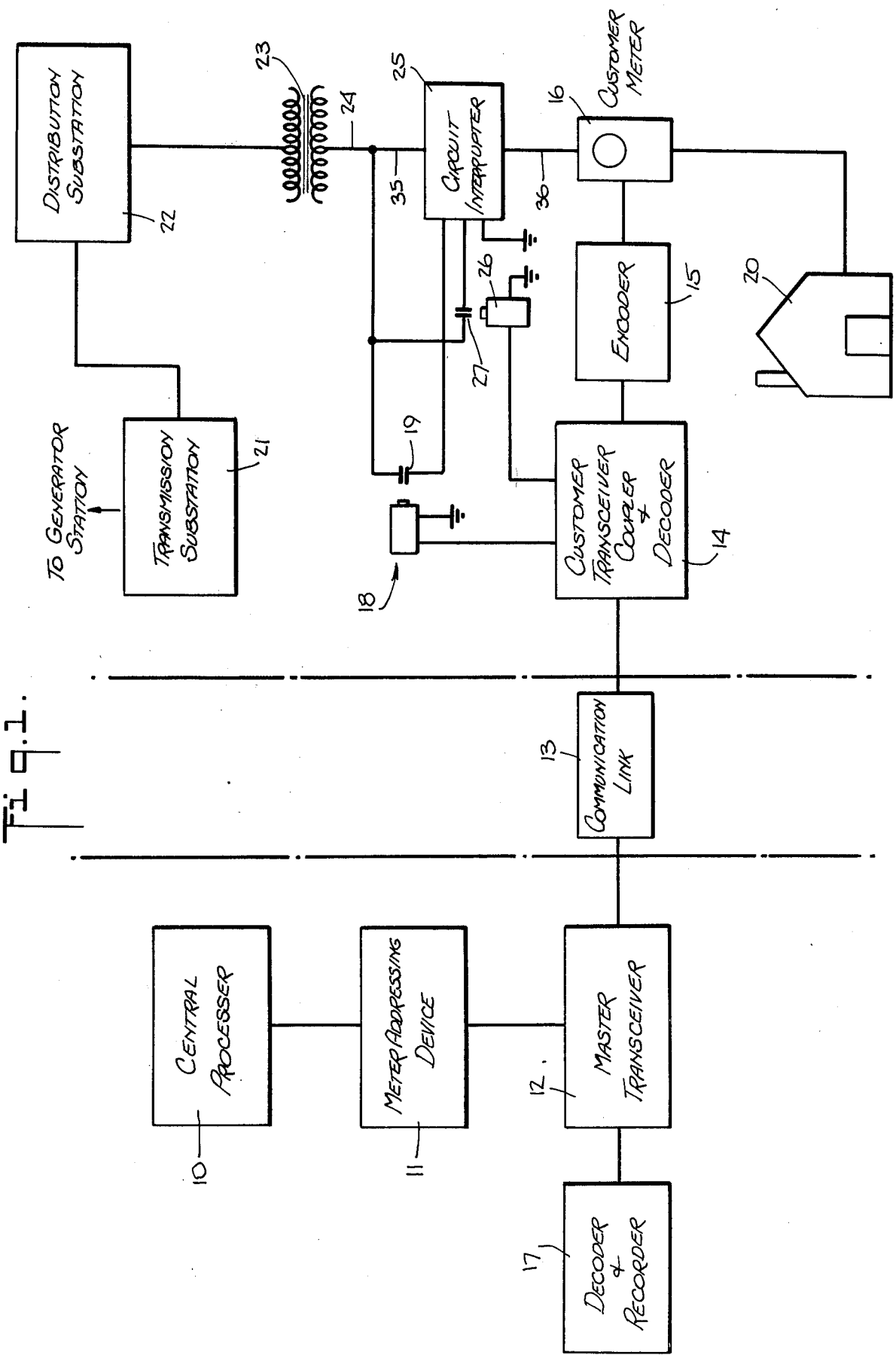

United States Patent [19]

Cahill, Jr.

[11] 4,124,835
[45] Nov. 7, 1978

[54] REMOTELY CONTROLLED UTILITY SERVICE INTERRUPTER SYSTEM AND APPARATUS

[76] Inventor: William J. Cahill, Jr., 13 Woodthrush Dr., West Nyack, N.Y. 10994

[21] Appl. No.: 670,661

[22] Filed: Mar. 26, 1976

[51] Int. Cl.$^2$ .............................................. H01H 85/00
[52] U.S. Cl. ........................................ 337/1; 337/182; 337/187; 337/404; 361/104
[58] Field of Search ............... 317/14 R, 14 A, 14 D, 317/14 J, 15, 27 R, 37, 40 R, 40 A, 44, 60 R; 340/347 R, 347 P; 337/180, 182, 187, 190, 153, 219, 1, 404

[56] References Cited
U.S. PATENT DOCUMENTS

| | | | |
|---|---|---|---|
| 1,966,466 | 7/1934 | Smalley | 337/182 |
| 2,763,752 | 9/1956 | Paetow | 337/182 |
| 2,896,050 | 7/1959 | Tomlinson | 337/219 X |
| 3,451,053 | 6/1969 | Xenis et al. | 335/205 X |
| 3,575,681 | 4/1971 | Nusbaum | 337/182 X |
| 3,684,923 | 8/1972 | Keeler | 317/40 A X |
| 3,793,559 | 2/1974 | Ristuccia | 317/27 R X |
| 3,821,605 | 6/1974 | Pendrak | 317/14 R |
| 3,846,788 | 11/1974 | Calabro et al. | 340/347 P |
| 3,855,503 | 12/1974 | Ristuccia | 317/27 R |
| 3,883,781 | 5/1975 | Cotton | 317/14 R |
| 3,898,649 | 8/1975 | Beck | 340/347 P |

Primary Examiner—Patrick R. Salce
Attorney, Agent, or Firm—Brooks, Haidt, Haffner & Delahunty

[57] ABSTRACT

Apparatus for selectively disconnecting the electric service of individual customers from an electric power supply line by electrical signals transmitted from a central point remote from the customer's premises. A circuit interrupter, such as a circuit breaker or, preferably, a fuse, is connected in series with the circuit of each of the customers, and is operated by a coded signal, transmitted from the central point by radio waves or over telephone or power lines, which is received by apparatus at the customer's premises and thereupon actuates the interrupter. Preferably, the coded signal is transmitted to the customer's premises using the same apparatus used to remotely read the customer's utility service meter, such being an Automatic Remote Meter Reading (ARMR) system of a known type which would also be installed. Also, novel remotely operable fuses which are particularly suited for use as the circuit interrupter in the system are described.

2 Claims, 3 Drawing Figures

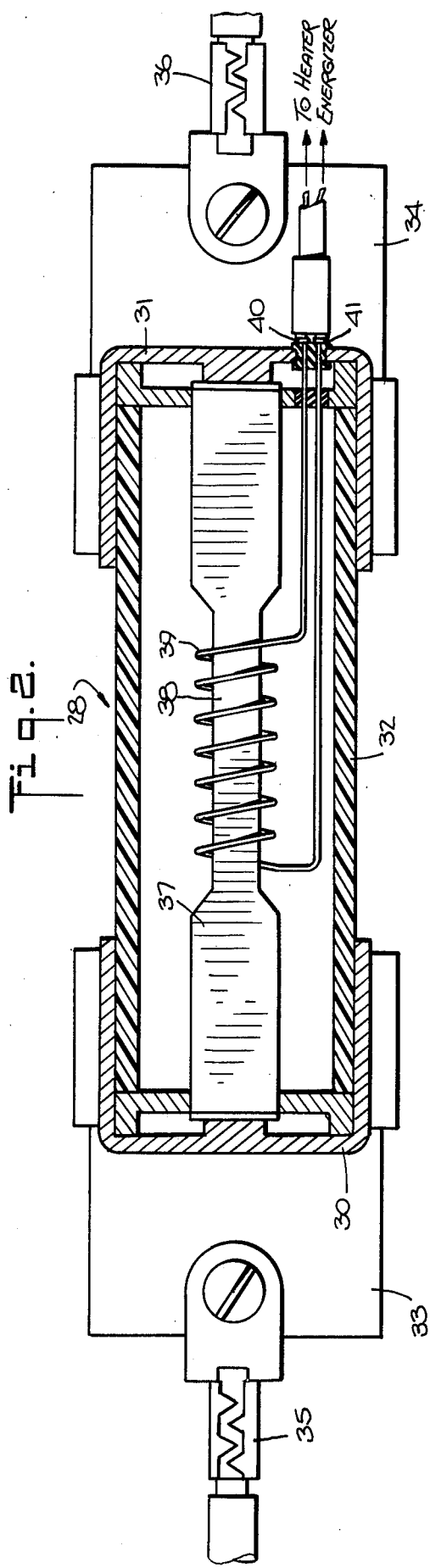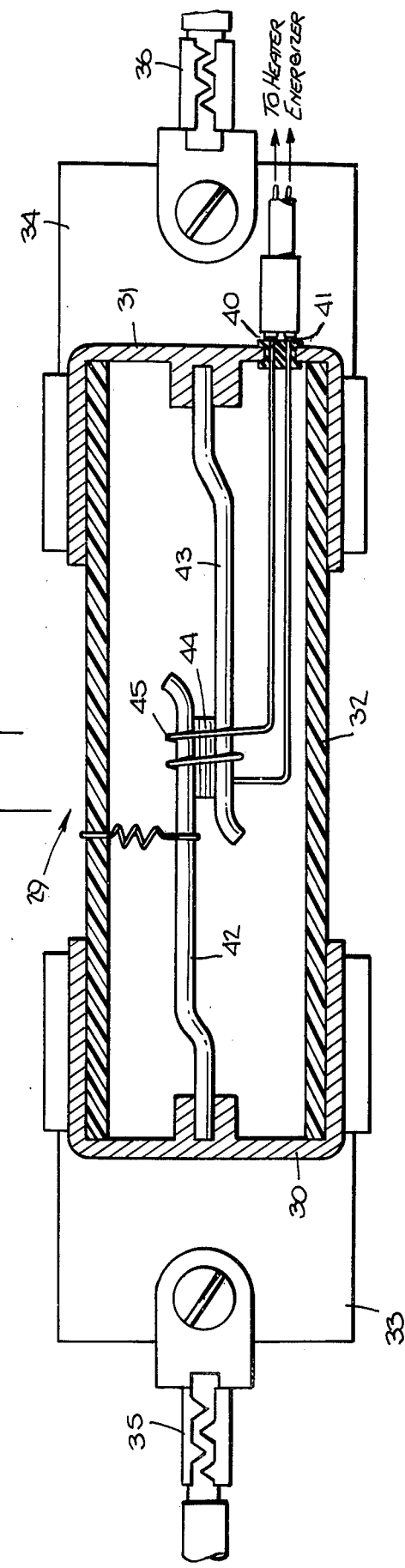

REMOTELY CONTROLLED UTILITY SERVICE INTERRUPTER SYSTEM AND APPARATUS

The invention relates to methods and apparatus by which a public utility company may selectively disconnect the service from one or more of its customers, and more particularly to methods and apparatus for automatically interrupting electric service to an electric power customer from a location remote from the location of the customer's entrance service equipment.

Electrical service to a customer usually is provided to the customer's electrical equipment through a switch and/or fuse and a power consumption meter located on the customer's premises, either inside or outside a building. For billing purposes, the meter is read periodically, such as monthly. A significant cost to the electricity supplier is the expense and difficulty of obtaining meter readings. For example, if the meters are read visually, a substantial number of employees is required, and if the meter is within the customer's building, several attempts to read the meter must sometimes be made because of lack of access to the interior of the building, the owner being absent, etc.

Systems for remote reading of utility meters are well-known in the art. See, for example, U.S. Pat. No. 3,451,053 and the articles published in "Instruments & Control Systems", August 1961, Vol. 34, pages 1462-3; "Electrical World", June 15, 1974, pages 54-56; "Distribution", Spring 1972, pages 6-8; "Pipeline & Gas Journal", April 1975; "Communications News", June 1975; and "The Data Communication User", August 1975, pages 39 and 40, the disclosures of all of which are incorporated by reference herein. Although such systems eliminate some of the problems and expense of meter reading, such as a reduction in the number of meter-reading employees and/or elimination of the need for access to the customer's premises, a substantial investment is required, not only in the modification and replacement of meters commonly in use, but also in the furnishing and installing of the equipment required to read the meters remotely. For this reason, automatic remote meter reading systems proposed thus far have not been able to compete on an economic basis with the reading of meters by meter-reading employees.

In various areas, such as the New York City area, it is necessary to interrupt the electric service to several hundreds of thousands of customers each year because customers move, or for other reasons. Expenses and other problems, similar to those encountered in meter reading, are involved in interrupting electrical service to a customer.

One object of the invention is to provide apparatus for use by a public utility for disconnecting electric service to a customer from a location remote from the customer's meter installation. Such apparatus should be relatively tamper-proof or hidden from view, to avoid or at least minimize the chance for unauthorized re-connection of the service.

Another object of the invention is to make remote meter reading systems more acceptable from the economic standpoint and more competitive with other systems for reading meters by adding thereto apparatus which will permit remote interruption of electric service to a customer.

These and other objects of the invention are attained in the preferred embodiment of the invention by connecting a fuse, or fuses, upstream of the power consumption meter of each customer which can be "blown" remotely, and hence, will open the electrical circuit at the customer's premises. Preferably, the fuse is located immediately in advance of the meter and is inaccessible to the customer, but, of course, the fuse may be located at any point where it will interrupt electric service to an individual customer without affecting other customers.

In the various types of automatic remote meter reading systems coded signals are transmitted by electromagnetic waves or wires from a central point, such as a utility office or substation, to signal receiving and decoding apparatus at each of the customer's premises for causing the latter apparatus to read the customer's meter and return a coded signal or signals representative of the meter reading, to the central point. In an embodiment of the invention a further coded "interrupt" or "disconnect" signal is transmitted, when desired, from the central point to the appropriate customer's receiving and decoding apparatus where, by control of a device, such as a relay, it causes said fuse, or fuses, to "blow".

In the preferred embodiment of the invention, the fuse is of a novel type in which a fusable link is not in electrical series with the means for interrupting the circuit, so that it is not necessary that such means be able to carry the current of the customer's electrical load. Instead, the link is caused to melt or "blow" by a separate heater adjacent the link and separately energized only upon receipt of a disconnect signal.

Other objects and advantages of the invention will be apparent to those skilled in the art from the following detailed description of presently preferred embodiments thereof, which description should be considered in conjunction with the accompanying drawings in which:

FIG. 1 is a schematic, block diagram of an automatic remote meter reading system incorporating the apparatus of the invention; and FIGS. 2 and 3 are enlarged, cross-sectional views, taken longitudinally, of respective preferred embodiments of fuses, either of which may form a part of the system illustrated in FIG. 1.

Although the principles of the invention may be used in other ways, the invention will be described in connection with its use in conjunction with a typical automatic remote meter reading system which is illustrated in FIG. 1. In the typical automatic remote meter reading system which is illustrated in FIG. 1, at a central location within a public utility system a programmed central processer 10 controls a meter addressing device 11 which generates a customer selection signal and a meter selection signal. The signals are supplied to the transmitter portion of a master tranceiver 12 which transmits the signals by way of a communication link 13 to the receiver portion of a transceiver, coupler and decoder 14 at the customer's premises. The communication link 13 may, for example, be telephone lines, power lines or electromagnetic waves. In the latter two cases, the signals are used to modulate carrier waves at the transceiver 12, such carrier waves normally having a frequency substantially higher than the frequency of the electrical energy being metered.

At the transceiver, coupler and decoder 14, the signals are employed to establish circuits and read one or more meter operable devices, such as an encoder 15 connected to the customer's meter 16. The meter readings actuate the transmitter portion of the transceiver 14 which transmits signals corresponding to the meter reading through the communication link 13 to the receiver portion of the transceiver 12. The received signals are supplied to a decoder and recorder 17 where the meter reading information, along with the customer's identity, usually is printed or recorded on punched cards.

Therefore, it will be apparent to those skilled in the art, that by the appropriate selection and transmission of signals from the transceiver 12, a circuit may be selectively established at the customer's premises which may be used to actuate various devices and may, for example, actuate a relay 18 having normally open contacts 19.

In a typical electrical supply system, electrical power is supplied to the customer, e.g., a customer who occupies the house 20, by way of a transmission substation 21, a distribution substation 22 and a pole, subterranean or other transformer 23. Normally, the customer's line 24 from the transformer connects to the customer's circuits through a power consumption meter 16 and appropriate fuses and breakers. In accordance with the invention, the line 24 is connected to the customer's meter 16 through a circuit interrupter 25 which is inaccessible to the customer and which is caused to open when the contacts 19 of the relay 18 are closed. Although the circuit interrupter 25 may be a conventional remotely operable circuit breaker, it is preferable for economic reasons to employ a fuse of the type hereinafter described for the purpose of interrupting the supply of electrical energy to the customer.

Normally, the automatic remote meter reading system will be employed in its usual manner, and as described in the publications referred to hereinbefore. For as long as the customer is receiving electrical power service, the meter reading system will function to read the customer's meter or meters. However, whenever it is desired to disconnect the customer from the electrical power line 24, the central processer 10 causes the meter addressing device to send both a customer selection signal and a customer disconnect signal, different from the meter select signal but of the same kind, and the disconnect signal, when received at the customer's transceiver 14, will cause energization of the relay 18 and hence, operation of the interrupter 25. If only one meter is readable by the system at the customer's premises, e.g., the electrical power consumption meter, a signal as might otherwise be used to read another meter, e.g., a water or gas meter, may be used to energize the relay 18.

After transmission of the disconnect signal, either one time or for a predetermined time, the disconnect signal is discontinued, and the relay 18 becomes de-energized opening the contacts 19. However, the circuit interrupter 25 will remain open until replaced or reset. Confirmation of the open condition of the interrupter 25 may be carried out by subsequent reading of the meter 16 in the normal manner, a change in the reading of the meter 16 indicating that the interrupter 25 is not open.

If the circuit interrupter 25 is of the type described hereinafter, it will be necessary that the fuse be replaced manually when electrical power service is restored to the customer. Similarly, if the circuit interrupter 25 is of the type which remains open until manually reset, it will have to be reset manually in order to restore electrical service to the customer. However, if the circuit interrupter 25 is of the type which can be reset remotely, e.g., of the stepping type or has a reset coil, then electrical service can be restored to the customer in a manner similar to that in which electrical service is interrupted.

For example, if the circuit interrupter 25 is of the type which can be reset by a second energization of the relay 18, e.g., a circuit interrupter of the stepping type, then electrical service can be restored remotely by a second energization of the relay 18. On the other hand, if the circuit interrupter 25 has a separate reset coil, then it may be reset, i.e., closed, by a "restore" signal transmitted to the transceiver 14 and caused to energize the relay 26 having contacts 27 connected in series with the reset coil of the circuit interrupter 25. Such "restore" signal would be similar to the "disconnect" signal except that it would be distinguishable therefrom by the decoder so as to operate the relay 26 rather than the relay 18.

Although the circuit interrupter 25 may be a circuit breaker of any of the types previously described, such breakers are relatively expensive and more costly to install as compared to the cost of a fuse and its installation. Furthermore, whereas a circuit breaker may be merely reset, unauthorized reconnection of the customer's service line to the power distribution line becomes at least somewhat more difficult in the case of a fuse-type interrupter because a replacement fuse is required. In this regard, the fact is well known that customers who intend to do so are ingenious in gaining unauthorized access to protected utility controls.

Remotely operable fuses are known in the art. See, for example, U.S. Pat. No. 2,896,050. Although such a fuse might be employed as the circuit interrupter 25, it has the disadvantage that the fusible element which is fusible remotely must also carry the normal load current, making it necessary to provide a higher current to "blow" the fuse. It is therefore preferable to employ a fuse of a type as illustrated in either of FIGS. 2 or 3 and described hereinafter, because the element energized to remotely "blow" the fuse is independent of the load current and, therefore, the magnitude of the current required to "blow" the fuse may be substantially less than the load current. In such cases the fuse can be controlled using a comparatively inexpensive relay.

Externally, either of the fuses 28 and 29 illustrated in FIGS. 2 and 3 may be of a conventional form and may comprise a pair of electrically conductive end caps or contacts 30 and 31 on a tubular body 32 of insulating material. The caps 30 and 31 are received in connectors 33 and 34 to which the power line 35 and the customer's line 36 are respectively connected (See FIG. 1).

Internally, the fuse 28 (FIG. 2) may comprise a link or fusible element 37 of a conventional type and made of a meltable or fusible metal. The fusible element 37 is made of a material and a size sufficient to carry the customer's load current without fusing, and is electrically connected at its ends to the caps 30 and 31. The central portion 38 of the fusible element 37 has an electrically energizable heating element 39 adjacent thereto, the latter having a pair of terminal ends 40 and 41. The heating element 39 may, for example, be a helical coil of nichrome or other wire having a resistivity which is high relative to copper wire and may be wound around, but insulated from, the central portion 38 of the fusible element 37. The characteristics of the heating element 39 are selected in a known manner so as to heat the portion 38 to fusing temperature, thus to interrupt the main power connection provided by the fusible element 37 between the fuse caps 30, 31 when the heating element terminals 40 and 41 are connected to an available electrical power source.

It will be observed that in FIG. 2, both heating element terminals 40 and 41 are electrically isolated, i.e., not connected by a low impedance or low resistance connection to the fusible element 37. Thus, the element 39 does not normally carry the customer's load current. However, the same result is obtained if only one of the terminals 40 and 41 is electrically connected to the element 37 such as by connecting the terminal 40 or 41 to the line 35 which connects to the line 24 in FIG. 1, the other of the terminals 40 or 41 being connected to one of the relay contacts 19.

Internally, the fuse 29 (FIG. 3) may comprise a pair of electrically conductive members 42 and 43, the member 42 extending from and being electrically connected to the cap 30 and the member 43 extending from and being electrically connected to the cap 31. It will also be noted that the members 42 and 43 extend adjacent one another. A pellet 44 of fusible metal is disposed between and in electrical contact with the members 42 and 43, and an electrical heating element 45 is adjacent, and preferably surrounds the fusible pellet 44. The heating element 45 has a construction and characteristics similar to those of the heating element 39 so that when it is electrically energized by way of its end terminals 40 and 41, the pellet 44 fuses or melts and the circuit between the caps 30 and 31 is interrupted. The terminals 40 and 41 may be connected as described in connection with FIG. 2, at least one of the terminals 40 or 41 being electrically isolated from the pellet 44.

When either of the fuses 28 or 29 is employed as the circuit interrupter 25 (FIG. 1), receipt of the coded "disconnect" signal at the transceiver 14 causes closing of the contacts 19 which completes a circuit for energizing the heating element 39 or 45 which causes the fusible portion 38 or 44 of the fuse to "blow" and interrupt the connection between the customer's circuits and the line 24.

Although the invention has been described in connection with its application to the interruption of electrical service, it will be apparent to those skilled in the art that it may also be applied to the interruption of other utility services, such as gas or water services. For example, the circuit interrupter 25 may be a solenoid-controlled gas or water valve, instead of an electrical circuit breaker or fuse, connected between the supply line and the customer's equipment and which may be closed when the relay 18 is energized thereby closing the contacts 19 which complete an energizing circuit for the solenoid of the gas or water valve.

As used herein, the expression "remote from the customer's premises" usually means at a substantial distance, e.g., greater than a few hundred feet, from such premises. However, the invention may also be used when the point at which the "disconnect" signal originates is on the customer's premises, such as, for example, at the exterior of the building containing the customer's equipment, and such point is intended to be included within said expression. Furthermore, the disconnect signal may be merely the application of a voltage, to suitable wires extending from the circuit interrupter 25, e.g., terminals 40 and 41, or the relay 18, to the exterior of the building, such voltage causing operation of the interrupter 25 either directly, or indirectly by way of the relay 18. In such latter cases, the devices 10-15 and 17 (FIG. 1) may be omitted.

Thus has been described a remotely controlled utility service interrupter system and apparatus which achieves all of the objects of the invention. Although preferred embodiments have been illustrated and described, it will be apparent to those skilled in the art that various modifications may be made without departing from the principles of the invention.

What is claimed is:

1. A remotely operable fuse comprising a fuse body, a pair of spaced electrically conductive members on said body forming electric contacts, electrically conductive fusible means having a pair of opposite ends one of which is electrically connected to one of said contacts and the other of which is electrically connected to the other of said contacts, said electrically conductive fusible means comprising a pair of non-fusible electrically conductive members, one member being electrically connected to and extending from said one of said contacts and the other member being electrically connected to and extending from said other of said contacts to adjacent said one member, and a pellet of fusible metal disposed between and electrically connecting said members, an electrically energizable heating element adjacent to but spaced from said fusible means intermediate said ends thereof, said heating element having a pair of terminal ends at least one of which is electrically isolated from said fusible means, and means for connecting said terminal ends of the heating element to a source of electrical energy for thereby energizing said heating element and causing fusing of said fusible means.

2. A remotely operable fuse as set forth in claim 1, wherein said heating element comprises a helically wound coil of wire extending around and spaced from said members and said pellet.

* * * * *